(12) United States Patent
Muchow et al.

(10) Patent No.: US 7,667,282 B2
(45) Date of Patent: Feb. 23, 2010

(54) MICROMECHANICAL COMPONENT AND METHOD FOR MANUFACTURING SUCH A COMPONENT

(75) Inventors: Joerg Muchow, Reutlingen (DE); Torsten Ohms, Gerlingen (DE); Volkmar Senz, Metzingen (DE); Guenther-Nino-Carlo Ullrich, Reutlingen (DE); Ronald Gampp, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 169 days.

(21) Appl. No.: 11/187,346

(22) Filed: Jul. 21, 2005

(65) Prior Publication Data
US 2006/0021961 A1  Feb. 2, 2006

(30) Foreign Application Priority Data
Jul. 27, 2004  (DE) .................... 10 2004 036 433

(51) Int. Cl.
*H01L 29/78* (2006.01)
(52) U.S. Cl. .................... 257/414; 257/415; 257/419

(58) Field of Classification Search .................. 257/414
See application file for complete search history.

(56) References Cited

U.S. PATENT DOCUMENTS

| | | | |
|---|---|---|---|
| 6,912,759 B2 * | 7/2005 | Izadnegahdar et al. | 29/25.35 |
| 7,109,121 B2 * | 9/2006 | Lal et al. | 438/703 |
| 2005/0093533 A1 * | 5/2005 | Christenson et al. | 324/152 |

FOREIGN PATENT DOCUMENTS

SE  9601778 A  * 11/1997

\* cited by examiner

*Primary Examiner*—Kenneth A Parker
*Assistant Examiner*—Jose R Diaz
(74) *Attorney, Agent, or Firm*—Kenyon & Kenyon LLP

(57) ABSTRACT

A method and a micromechanical component which counteract manufacturing-process-related mechanical stresses in the membrane are provided. The membrane is formed on a substrate in a layer system and spans a cavity in the substrate. The layer system includes at least one base layer formed on the substrate for circuit elements. At least one structured masking layer is also formed on the base layer for defining the circuit elements. The masking layer is structured in the area of the membrane in such a way that mechanical stresses acting in the area of the membrane under vacuum are at least partially compensated, the intrinsic stress of the masking layer being taken into account in the layout of the structuring.

11 Claims, 4 Drawing Sheets

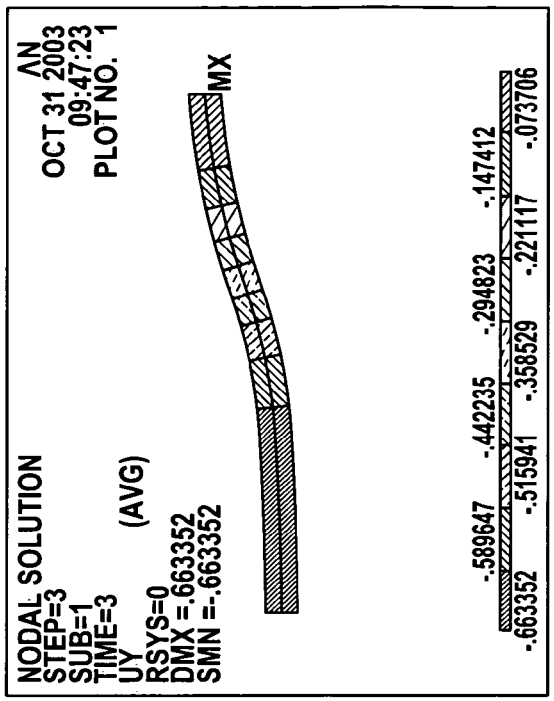
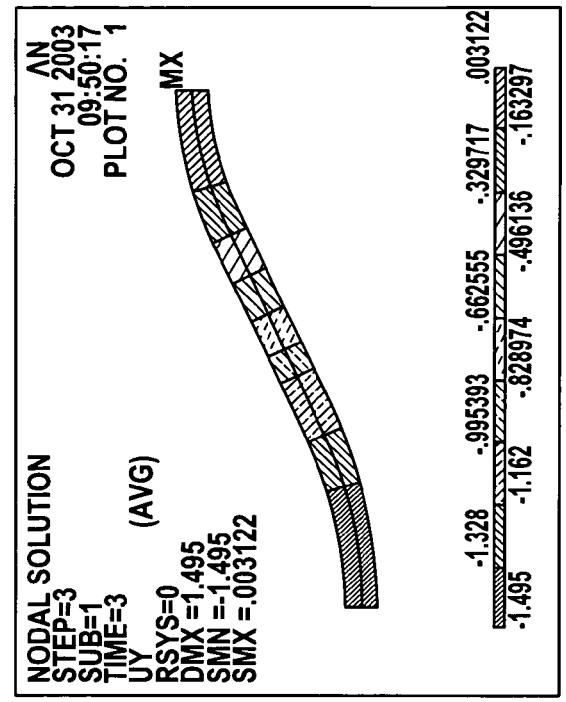
Fig. 2a　　　　　　　　Fig. 2b
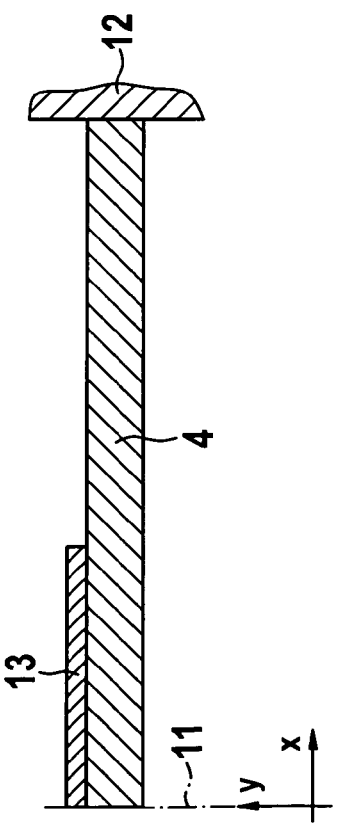
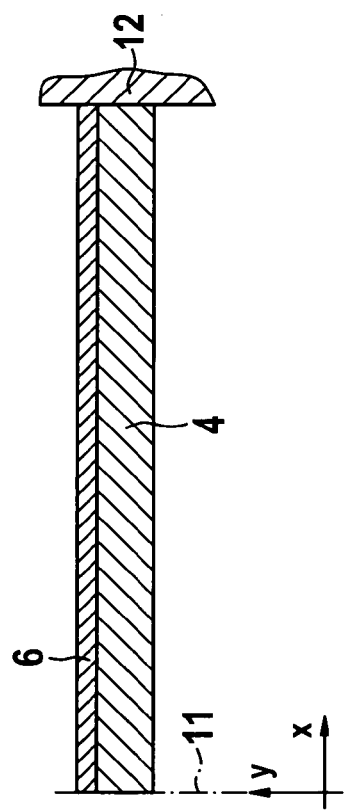

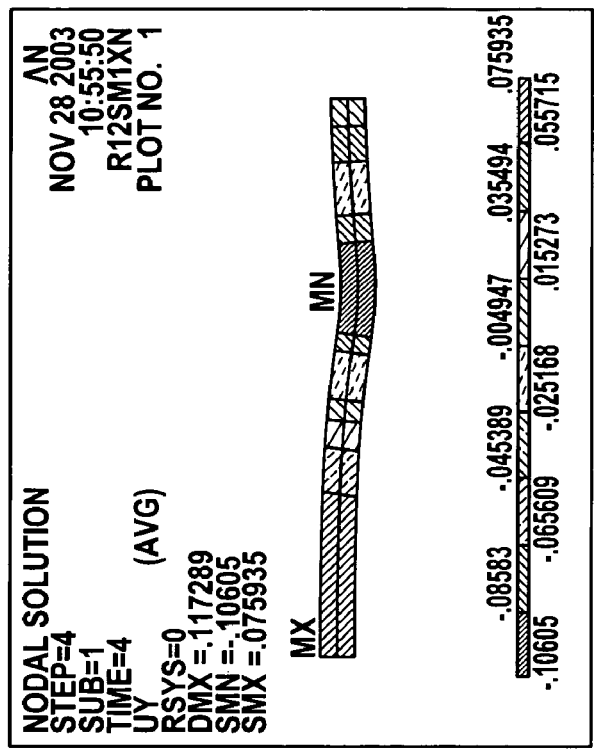
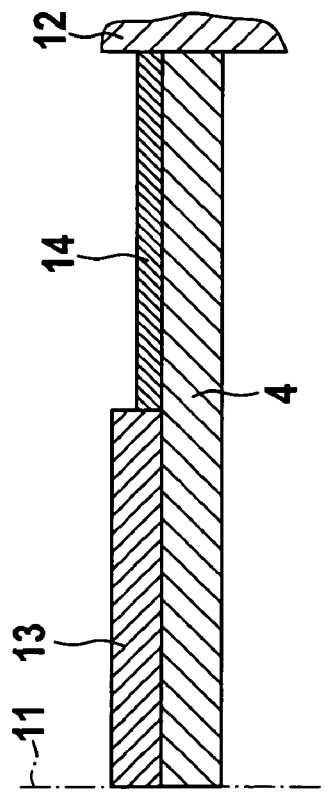
Fig. 4

MICROMECHANICAL COMPONENT AND METHOD FOR MANUFACTURING SUCH A COMPONENT

FIELD OF THE INVENTION

The present invention relates to a micromechanical component having at least one membrane, the membrane being formed in a layer system on a substrate and spanning a cavity in the substrate, and the present invention also relates to a method for manufacturing such a micromechanical component.

BACKGROUND INFORMATION

In the field of sensor applications, components are often used in practice which include micromechanical components such as a membrane, for example, in addition to an integrated circuit. For cost reasons and considerations regarding miniaturization of such components, it is advantageous to structure the membrane before the actual semiconductor process. In a conventional manufacturing method known in the art, for example, a porous area is first produced in the surface of a silicon substrate. After growing an epitaxial silicon layer on the substrate surface, the porous area is transformed into a cavity at high temperatures; this cavity is spanned and sealed by the thin epitaxial layer. The cavity usually contains a vacuum. The epitaxial silicon layer is used not only for sealing the cavity, but it also functions as a base layer for circuit elements, which are subsequently produced by deposition or diffusion, for example. In general, high-temperature steps, carried out at a process pressure of up to one atmosphere, are required for producing the circuit elements.

It has been found that the membrane of a component, which, as described previously, is exposed prior to processing of the circuit elements, has a deflection toward the cavity even at room temperature and vacuum (p=0 bar).

This effect is at least in part due to the material properties of the silicon layer. Although silicon has an almost perfect elastic behavior at room temperature, it becomes softer and plastically deformable if the ambient temperature rises over 500 K to 800 K. Since some of the deposition processes that are required for manufacturing the circuit elements take place under pressure and at significantly higher temperatures of over 1000 K, while the cavity has vacuum in it, the thin silicon layer over the cavity is deformed inward toward the cavity. In this case, the edge of the cavity, i.e., the membrane, is under tensile stress, while the center of the membrane is under compressive stress. At high process temperatures the silicon layer is plastically deformed, at least at the points of high tensile stress. This plastic deformation remains preserved even at room temperature and without external pressure.

In addition, the elastic deformation of the thin silicon layer is "frozen in" by deposition of further layers under pressure. Even the first layer deposited on the deformed silicon layer is formed on a surface that is larger than that of the undeflected silicon layer. Therefore, this deposited layer functions as a wedge, which prevents the full relaxation of the silicon layer when the process pressure is removed. This effect is further reinforced by the production of further layers. Mechanical stresses acting in the membrane under vacuum (p=0 bar) are thus "frozen in."

The circuit elements situated on or in the membrane are usually components of an analyzer circuit, such as a Wheatstone bridge circuit, for example, with which, for example, the pressure that a corresponding deflection of the membrane causes may be determined. The mechanical stresses "frozen in" in the membrane, which remain effective even at an ambient pressure of p=0 bar, often result in practical problems in signal detection and analysis. In the case of an integrated bridge circuit, the mechanical stresses "frozen in" in the membrane result in an undesirable stress offset shift.

SUMMARY

The present invention provides measures that counteract the mechanical stresses "frozen in" in the membrane of a component of the aforementioned type. The membrane is to be affected in a controlled manner in such a way that basic deflection is prevented.

For this purpose, according to the present invention, the masking layer is structured in the area of the membrane in such a way that mechanical stresses acting in the cavity in the area of the membrane under vacuum (p=0 bar) are at least partially compensated.

In the context of the present invention, it has been recognized that the process-related deflection of the base layer during the processing of the circuit elements and during the formation of the membrane significantly contributes to the occurrence of "frozen-in" mechanical stresses in the membrane of a component. It has been further recognized that a deflection of the base layer is to be compensated, to the degree possible, before additional layers are deposited, because the membrane structure becomes more rigid with each additional layer. The shape and position and, in particular, also an undesirable deformation or deflection of the membrane is manifested in this case. It has also been found in the context of the present invention that the masking layers, which are normally used for defining the position and geometry of the circuit elements and are therefore applied directly on the base layer, have an intrinsic stress caused by grid mismatch. In addition, it has been recognized according to the present invention that it is possible to make use of this property of the masking layers by generating counter-moments in a controlled manner, which at least partially compensate the mechanical stresses occurring in the base layer. Therefore, it is provided according to the present invention that the masking layers be structured as a function of their intrinsic stress and the mechanical stresses present in the membrane area.

In an example embodiment of the micromechanical component according to the present invention, the structuring of the masking layer in the membrane area is configured in such a way that not only the effects of mechanical stresses but also those of plastic deformations are compensated.

As mentioned previously, the masking layers which are normally applied onto the base layer for processing the circuit elements have an intrinsic mechanical stress caused by grid mismatch when the layer material is deposited or grown. This intrinsic mechanical stress is a compressive stress in most cases. Field oxide produced on a silicon substrate layer at a process pressure of 1 bar should be mentioned here as an example. The intrinsic stress of such a field oxide layer is approximately −350 MPa. In some cases, however, the intrinsic mechanical stress is also tensile stress. Thus, the intrinsic stress of a silicon nitride layer on a silicon base layer produced at a process pressure of 0.3 bar is approximately +1000 MPa.

Normally, the central area of the membrane on the surface of the silicon layer is under compressive stress during processing of the circuit elements, while the edge area is under tensile stress. The compressive stress in the central area may be compensated using a masking layer having a negative intrinsic chemical stress (compressive stress) if at least one segment of the masking layer is situated in the central area of the membrane. A discontinuity occurs in the stress at the boundary surface between the silicon layer and the masking layer, because a compressive masking layer tends to expand, causing a tensile stress in the silicon layer underneath it. Therefore, it is advantageous to compensate the tensile stresses in the edge area with the aid of a masking layer which has a positive intrinsic chemical stress (tensile stress) by positioning at least one segment of the masking layer in the edge area of the membrane.

This structuring causes the membrane to be deformed, which in turn positively affects the local stress states of the piezoelectric resistors.

In the case of components of the type discussed here, a silicon layer, e.g., a monocrystalline epitaxial layer, may be used as a base layer. A structured $SiO_2$ field oxide layer may be used in this case as a masking layer when processing the circuit elements. This has been found to be advantageous also with regard to the present invention, since such $SiO_2$ layers have a relatively high negative intrinsic stress. Relatively high counter-moments are thus generatable in this way in areas of high compressive stress in the membrane by using suitable structuring. In addition, a $SiO_2$ layer may be easily structured using an appropriate silicon nitride mask ($Si_3Ni_4$). This has been found to be advantageous, since silicon nitride layers have a relatively high positive intrinsic stress. The structure of the silicon nitride mask, which complements the structuring of the $SiO_2$ layer, thus produces relatively high counter-moments in the edge area of the membrane where a high tensile stress prevails.

BRIEF DESCRIPTIONS OF THE DRAWINGS

FIG. 2a shows a cross-sectional view illustrating a section of the base layer of a membrane having a masking layer structured according to the present invention, and a graph illustrating the corresponding manufacturing-related deflection of the membrane, with the illustration assuming a two-dimensional, rotationally symmetric membrane.

FIG. 2b shows a cross-sectional view illustrating a section of the base layer of a membrane having an unstructured masking layer, and a graph illustrating the corresponding manufacturing-related deflection of the membrane, with the illustration assuming a two-dimensional, rotationally symmetric membrane.

FIG. 4 shows a cross-sectional view illustrating a section of the base layer of a membrane having two complementarily structured masking layers, and a graph illustrating the corresponding manufacturing-related deflection of the membrane, with the illustration assuming a two-dimensional, rotationally symmetric membrane.

DETAILED DESCRIPTION

Figure 1:
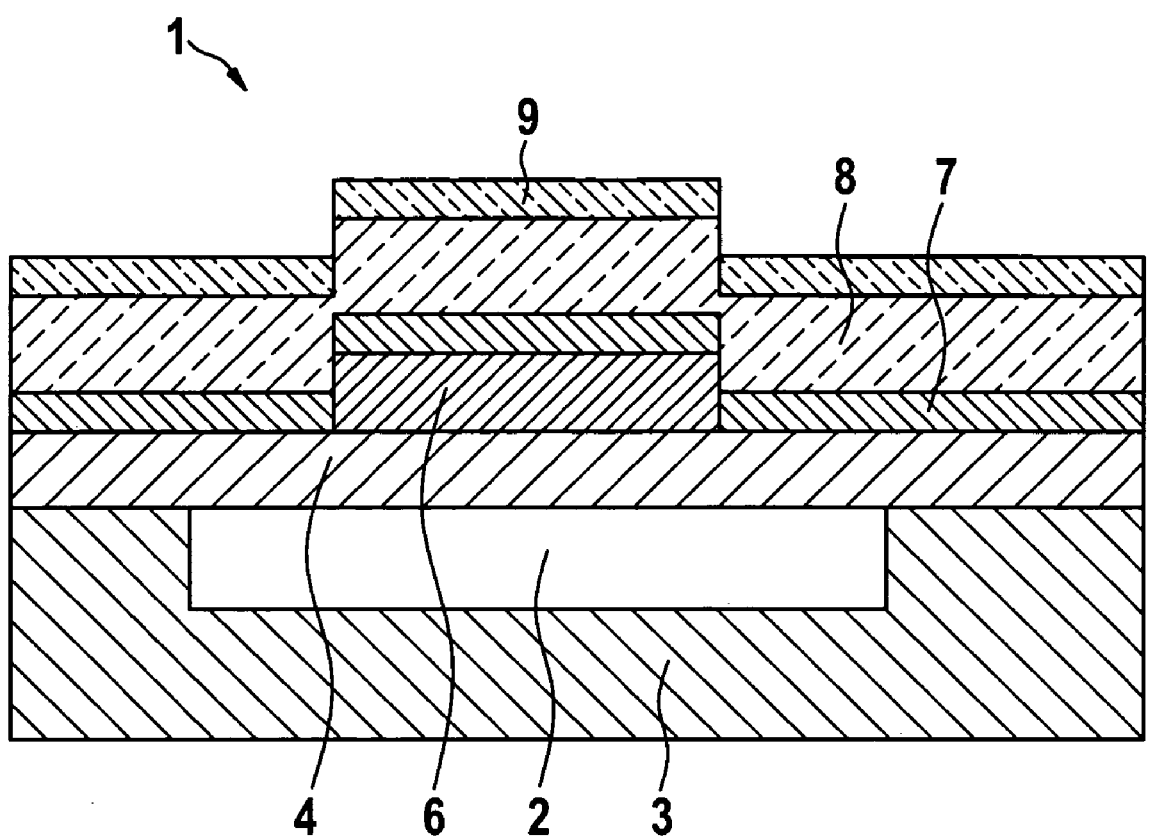
FIG. 1 is a cross-sectional view showing a section of the layer structure of a membrane of a micromechanical component.

FIG. 1 shows the layer structure of a membrane 1, which is the micromechanical component of a unit having integrated circuit elements. Membrane 1 spans a cavity 2, which is formed in substrate 3 of the unit. In the case illustrated here, a p-doped silicon substrate 3 is shown.

The layer structure of membrane 1 includes a base layer 4, which is formed directly on substrate 3 as a monocrystalline silicon epitaxial layer. Circuit elements in the form of doped regions are integrated in base layer 4. The position and geometry of the doped regions are defined with the aid of a masking layer 6 which has been produced on base layer 4 and appropriately structured.

During the processing of additional circuit elements, additional layers 7 through 9 of different materials are deposited, including outside the membrane area, over structured masking layer 6. These layers 7 through 9 stiffen the membrane structure and make membrane deformations occurring due to high process temperatures and pressures in some semiconductor processes visible. In addition, such multilayer systems exhibit bi-metallic effects which are caused by intrinsic stress and different thermal expansion coefficients of the layers.

It should also be pointed out here that the layer system including the layers having compression or tensile stress may also be deposited on the bottom side of the base layer by conducting the process accordingly. For this purpose, the base layer must be opened prior to the deposition process to allow an appropriate layer system to be formed within the cavity. The membrane may be resealed thereafter.

FIGS. 2a through 2b show a cross section through silicon base layer 4 of a membrane from axis of symmetry 11 of the membrane to edge area 12 of the membrane, i.e., only one-half of the lateral extent of the membrane is shown. Masking layer 6, implemented as a field oxide layer, is also shown. As mentioned previously, masking layer 6 is used to define the circuit elements in base layer 4. Accordingly, the masking layer is required only at a few points, namely in the surroundings of the circuit elements, which allows the remaining areas to be structured in any desired manner.

Figure 3:
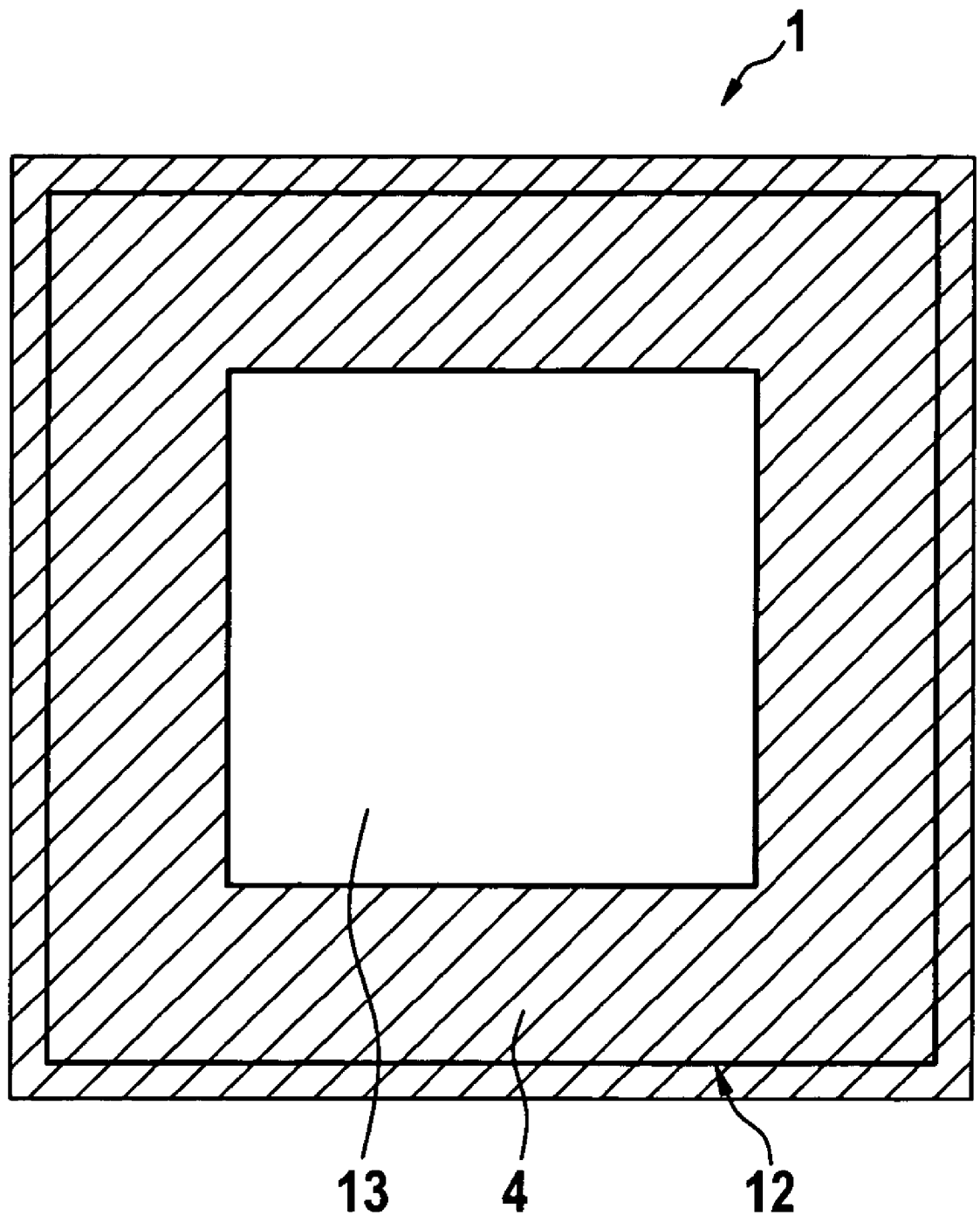
FIG. 3 shows a top view of the base layer illustrated in FIG. 2a having the masking layer structured according to the present invention.

In the structure shown in FIG. 2a, masking layer 6 is structured according to the present invention. In FIG. 2a, portions of masking layer 6 have been removed in the edge area of the membrane, so that a field oxide segment 13 of the masking layer 6 is situated only in the central area of the membrane. FIG. 3 shows a top view of the structure shown in FIG. 2a. In contrast, FIG. 2b corresponds to the configuration illustrated in FIG. 1.

If masking layer 6 is structured as shown in FIG. 2a, individual segments having a curvature defined by the particular layer pack are obtained. Field oxide, i.e., thermal $SiO_2$, is under compressive stress. It has an intrinsic chemical stress of approximately −350 MPa. The strongly negative stress in the field oxide layer causes this layer and thus also the surfaces of the adjacent layers to tend to expand. Therefore, an oxide segment in the central area of the membrane causes upward bulging. This bulging induces a counter-moment having an opposite sign outside the oxide segment in the base layer underneath it. The stress occurring during processing in the membrane area and in particular in its edge area may thus be counteracted by a suitable arrangement and size of the segment.

A comparison of the graphs of FIGS. 2a and 2b shows the smoothing effect of field oxide segment 13 (FIG. 2a) in the central area of the membrane. In contrast to the continuous masking layer (field oxide layer) 6 shown in FIG. 2b which manifests the manufacturing-related deformation of base layer 4, directed toward the inside of the cavity, field oxide segment 13 shown in FIG. 2a, situated in the central area of the membrane, pulls base layer 4 upward. The mechanical stress in the radial direction, i.e., on the surface of base layer 4, in the central area of the membrane is therefore strongly positive. In addition, the size of field oxide segment 13 has a substantial influence on the stress in the edge area of the membrane.

The process-related stresses occurring in the membrane area may be at least partially compensated with the aid of a material layer having an intrinsic tensile stress. This material layer may then be structured in such a way that at least one layer segment is situated in the edge area of the membrane. This layer segment causes a negative curvature and thus counteracts the tensile stress existing in the edge area of the membrane.

FIG. 4 shows an embodiment of the present invention which makes use of this effect. In this embodiment, base layer 4 is implemented in the form of a monocrystalline silicon epitaxial layer on a silicon substrate. A field oxide layer is used as a masking layer to define circuit elements in base layer 4. The field oxide layer is structured according to the present invention in such a way that there is a field oxide segment 13 only in the central area of the membrane. Similar to FIGS. 2a and 2b, FIG. 4 shows a cross section through silicon base layer 4 of a membrane from axis of symmetry of the membrane to edge area 12 of the membrane, i.e., only one-half of the lateral extent of the membrane is shown. The field oxide layer is structured in this example embodiment using a silicon nitride mask, i.e., a silicon nitride layer 14 structured complementarily. Since the intrinsic chemical stress of silicon nitride is approximately +1000 MPa, this silicon nitride mask 14, which is situated in the edge area of the membrane, supports the stress-compensating effect of field oxide segment 13 in the central area of the membrane. The graph of FIG. 4 shows that in the case described here only minimum deflection and deformation of the membrane is observed. A comparison between the graphs of FIGS. 4 and 2a illustrates the supplementary effect of silicon nitride mask 14.

What is claimed is:

1. A micromechanical component, comprising:
a substrate having a cavity;
a membrane provided on the substrate, over the cavity in the substrate, wherein the membrane has a layer system including at least one base layer formed on the substrate for circuit elements; and
at least one structured masking layer for defining the circuit elements formed on the base layer;
wherein the masking layer is structured in the area of the membrane according to mechanical stresses acting in the cavity in the area of the membrane under vacuum, such that the mechanical stresses are at least partially compensated by the structured masking layer,
wherein the masking layer has a compressive stress, and at least one segment of the masking layer is situated in a central area of the membrane where manufacturing-process-related compressive stresses prevail, and
wherein the masking layer has a tensile stress, and at least one segment of the masking layer is situated in the edge area of the membrane where manufacturing-process-related tensile stresses prevail.

2. The micromechanical component as recited in claim 1, wherein the masking layer is structured in the area of the membrane such that a plastic deformation of the membrane is at least partially prevented by the structured masking layer.

3. The micromechanical component as recited in claim 2, wherein the masking layer is formed on one of the top side and the bottom side of the base layer.

4. The micromechanical component as recited in claim 1, wherein the masking layer is formed on one of the top side and the bottom side of the base layer.

5. The micromechanical component as recited in claim 1, wherein the base layer is a monocrystalline epitaxial silicon layer, and wherein the masking layer is a $SiO_2$ layer.

6. The micromechanical component as recited in claim 1, wherein the base layer is a monocrystalline epitaxial silicon layer, and wherein the masking layer is a silicon nitride ($Si_3N_4$) layer.

7. The micromechanical component as recited in claim 1, wherein the masking layer is structured in the area of the membrane such that a plastic deformation of the membrane is at least partially prevented by the structured masking layer, wherein the masking layer is formed on one of the top side and the bottom side of the base layer, and wherein the masking layer has one of a positive intrinsic chemical stress and tensile stress, and at least one segment of the masking layer is situated in the edge area of the membrane where manufacturing-process-related tensile stresses prevail.

8. The micromechanical component as recited in claim 7, wherein the base layer is a monocrystalline epitaxial silicon layer, and wherein the masking layer is a $SiO_2$ layer.

9. A micromechanical component, comprising:
a substrate having a cavity;
a membrane provided on the substrate, over the cavity in the substrate, wherein the membrane has a layer system including at least one base layer formed on the substrate for circuit elements; and
at least one structured masking layer for defining the circuit elements formed on the base layer;
wherein the masking layer is structured in the area of the membrane according to mechanical stresses acting in the cavity in the area of the membrane under vacuum, such that the mechanical stresses are at least partially compensated by the structured masking layer,
wherein the masking layer has a compressive stress, and at least one segment of the masking layer is situated in a central area of the membrane where manufacturing-process-related compressive stresses prevail,
wherein the masking layer is structured in the area of the membrane such that a plastic deformation of the membrane is at least partially prevented by the structured masking layer, and
wherein the masking layer has a tensile stress, and at least one segment of the masking layer is situated in the edge area of the membrane where manufacturing-process-related tensile stresses prevail.

10. The micromechanical component as recited in claim 9, wherein the base layer is a monocrystalline epitaxial silicon layer, and wherein the masking layer is a $SiO_2$ layer.

11. The micromechanical component as recited in claim 9, wherein the base layer is a monocrystalline epitaxial silicon layer, and wherein the masking layer is a silicon nitride ($Si_3N_4$) layer.

* * * * *

UNITED STATES PATENT AND TRADEMARK OFFICE
CERTIFICATE OF CORRECTION

PATENT NO. : 7,667,282 B2
APPLICATION NO. : 11/187346
DATED : February 23, 2010
INVENTOR(S) : Muchow et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 175 days.

Signed and Sealed this

Seventh Day of December, 2010

David J. Kappos
*Director of the United States Patent and Trademark Office*